(12) United States Patent
Primo et al.

(10) Patent No.: US 8,948,326 B2
(45) Date of Patent: Feb. 3, 2015

(54) CIRCUIT ARCHITECTURE FOR I/Q MISMATCH MITIGATION IN DIRECT CONVERSION RECEIVERS

(71) Applicant: Analog Devices Technology, Hamilton (BM)

(72) Inventors: Haim Primo, Ganei Tikva (IL); Yosef Stein, Sharon, MA (US)

(73) Assignee: Analog Devices Technology, Hamilton (BM)

( * ) Notice: Subject to any disclaimer, the term of this patent is extended or adjusted under 35 U.S.C. 154(b) by 21 days.

(21) Appl. No.: 13/844,759

(22) Filed: Mar. 15, 2013

(65) Prior Publication Data

US 2014/0270018 A1    Sep. 18, 2014

(51) Int. Cl.
 *H04B 14/06* (2006.01)
 *H04L 25/03* (2006.01)
 *H03D 3/00* (2006.01)
 *H03D 7/16* (2006.01)
 *H04L 27/38* (2006.01)

(52) U.S. Cl.
 CPC .......... *H04L 25/03006* (2013.01); *H03D 3/009* (2013.01); *H03D 7/165* (2013.01); *H04L 27/3863* (2013.01); *H03D 2200/0054* (2013.01)
 USPC ............ 375/346; 375/296; 375/347; 375/348

(58) Field of Classification Search
 USPC .................. 375/346, 347, 348, 296
 See application file for complete search history.

(56) References Cited

U.S. PATENT DOCUMENTS

| | | | |
|---|---|---|---|
| 5,150,128 | A | 9/1992 | Kongelbeck |
| 2004/0002323 | A1 | 1/2004 | Zheng |
| 2009/0046003 | A1* | 2/2009 | Tung et al. ..................... 342/174 |
| 2010/0027689 | A1* | 2/2010 | Kohlmann ..................... 375/260 |
| 2011/0064166 | A1 | 3/2011 | Khoshgard |
| 2011/0134986 | A1* | 6/2011 | Skull et al. ..................... 375/229 |
| 2012/0270516 | A1 | 10/2012 | Kang |

FOREIGN PATENT DOCUMENTS

WO    2006-067681    6/2006

OTHER PUBLICATIONS

Marcus Windisch et al., "Performance Degradation due to I/Q Imbalance in Multi-Carrier Direct Conversion Receivers: A Theoretical Analysis", In Proceedings of 2006 IEEE International Conference on Communications, vol. 1; 6 pages.

(Continued)

*Primary Examiner* — Qutbuddin Ghulamali
(74) *Attorney, Agent, or Firm* — Patent Capital Group

(57) ABSTRACT

An electrical circuit includes a local oscillator configured to generate a first reference signal and a second reference signal having a predetermined phase shift with the first reference signal, an I-channel mixer configured to inject the first reference signal to an incoming signal and generate a first output, a compensation mixer configured to multiply the first output with a constant factor to generate a second output, a first low pass filter configured to approximately attenuate frequencies in the second output to generate a third output, and a first correcting filter configured to filter the third output to generate a fourth output. The first correcting filter is configured to reduce a channel impulse response mismatch between the first low pass filter and a second low pass filter, which is configured to attenuate frequencies in a Q-channel of the incoming signal. In specific embodiments, the phase shift includes 45°.

19 Claims, 3 Drawing Sheets

(56) References Cited

OTHER PUBLICATIONS

Isis Mikhael et al., "Adaptive IQ Mismatch Cancellation for Quadrature IF Receivers", 5 pages.

Ferenc Marki et al., "Mixer Basics Primer, A Tutorial for RF & Microwave Mixers", © 2010 Marki Microwave, Inc.; 12 pages.

Niels A. Moseley et al., "A Low-Complexity Feed-Forward I/Q Imbalance Compensation Algorithm" 17th Annual Workshop on Circuits, Nov. 23-24, 2006, Veldhoven, The Netherlands., 7 pages.

Ashkan Mashhour et al., "On the Direct Conversion Receiver—A Tutorial", Microwave Journal, Jun. 1, 2001, 12 pages.

Behzad Razavi, "Design Considerations for Direct-Conversion Receivers", IEEE Transactions on Circuits and Systems—II: Analog and Digital Signal Processing, vol. 44, No. 6, Jun. 1997, pp. 428-435.

European Search Report for European Application No. EP 14156857 mailed Jun. 6, 2014, 6 pages.

* cited by examiner

CIRCUIT ARCHITECTURE FOR I/Q MISMATCH MITIGATION IN DIRECT CONVERSION RECEIVERS

FIELD OF THE DISCLOSURE

This disclosure relates in general to the field of electronic devices and, more particularly, to circuit architecture for I/Q mismatch mitigation in direct conversion receivers.

BACKGROUND

A direct-conversion receiver (DCR), also called a homodyne receiver, demodulates incoming radio frequency signals using synchronous detection driven by a local oscillator. DCRs are applied in many electronic devices, including cellphones televisions, avionics, medical imaging apparatus, and software-defined radio systems. Complexity, cost, power dissipation, and number of external components have been some of the criteria in selecting receiver architectures for today's digital communications market. Of the many alternatives, DCR has emerged as the architecture of choice to best meet these requirements. However, the DCR architecture involves some design challenges including direct current (DC) offset, In-Phase/Quadrature phase (I/Q) mismatch, and even-order distortion, which can affect the DCR's performance if not managed properly.

SUMMARY OF THE DISCLOSURE

An example electrical circuit is provided and includes a local oscillator configured to generate a first reference signal and a second reference signal having a predetermined phase shift with the first reference signal, an I-channel mixer configured to inject the first reference signal to an incoming signal and generate a first output, a compensation mixer configured to multiply the first output with a constant factor to generate a second output, a first low pass filter configured to approximately attenuate frequencies in the second output to generate a third output, and a first correcting filter configured to filter the third output to generate a fourth output. The first correcting filter is configured to reduce a channel impulse response mismatch between the first low pass filter and a second low pass filter, which is configured to attenuate frequencies in a Q-channel of the incoming signal. In specific embodiments, the phase shift includes 45°, and the constant factor is two over square root of two.

As used herein, the term "local oscillator" includes an electronic oscillator that can generate a repetitive, oscillating electronic alternating current signal, for example, a sine wave or a square wave. The local oscillator can comprise any suitable architecture, including crystal oscillator, voltage controlled oscillator, feedback oscillator, etc. The term "mixer" includes an electronic circuit configured to multiply two input signals to generate a third output signal. As used herein, the term "low pass filter" includes a suitably configured electronic circuit configured to pass low frequency signals (below a preconfigured threshold frequency) and attenuate signals with frequencies higher than the threshold frequency. An example low pass filter comprises a resistor in series with a load and a capacitor in parallel with the load.

In specific embodiments, the electrical circuit further includes a Q-channel mixer configured to inject the second reference signal to the incoming signal to generate a fifth output, where the second low pass filter is configured to approximately attenuate frequencies in the fifth output to generate a sixth output, a second correcting filter configured to filter the sixth output to generate a seventh output, where the second correcting filter is configured to reduce the channel impulse response mismatch between the first low pass filter and the second low pass filter, an alpha mixer configured to inject a gain correction to the seventh output to generate an eighth output, and a gain correction adder configured to add the eighth output with the fourth output to generate a ninth output.

In specific embodiments, the I-channel mixer, the Q-channel mixer, and the compensation mixer are in an analog domain, and the first low pass filter, the second low pass filter, the first correcting filter, the second correcting filter, the alpha mixer, and the gain correction adder are in a digital domain. In some embodiments, a first set of filter coefficients of the first correcting filter, a second set of filter coefficients of the second correcting filter and the gain correction are determined by minimizing a predetermined cost function, which can be a function of the power of the incoming signal. In some embodiments, the cost function may be processed by a digital signal processor.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Figure 1:
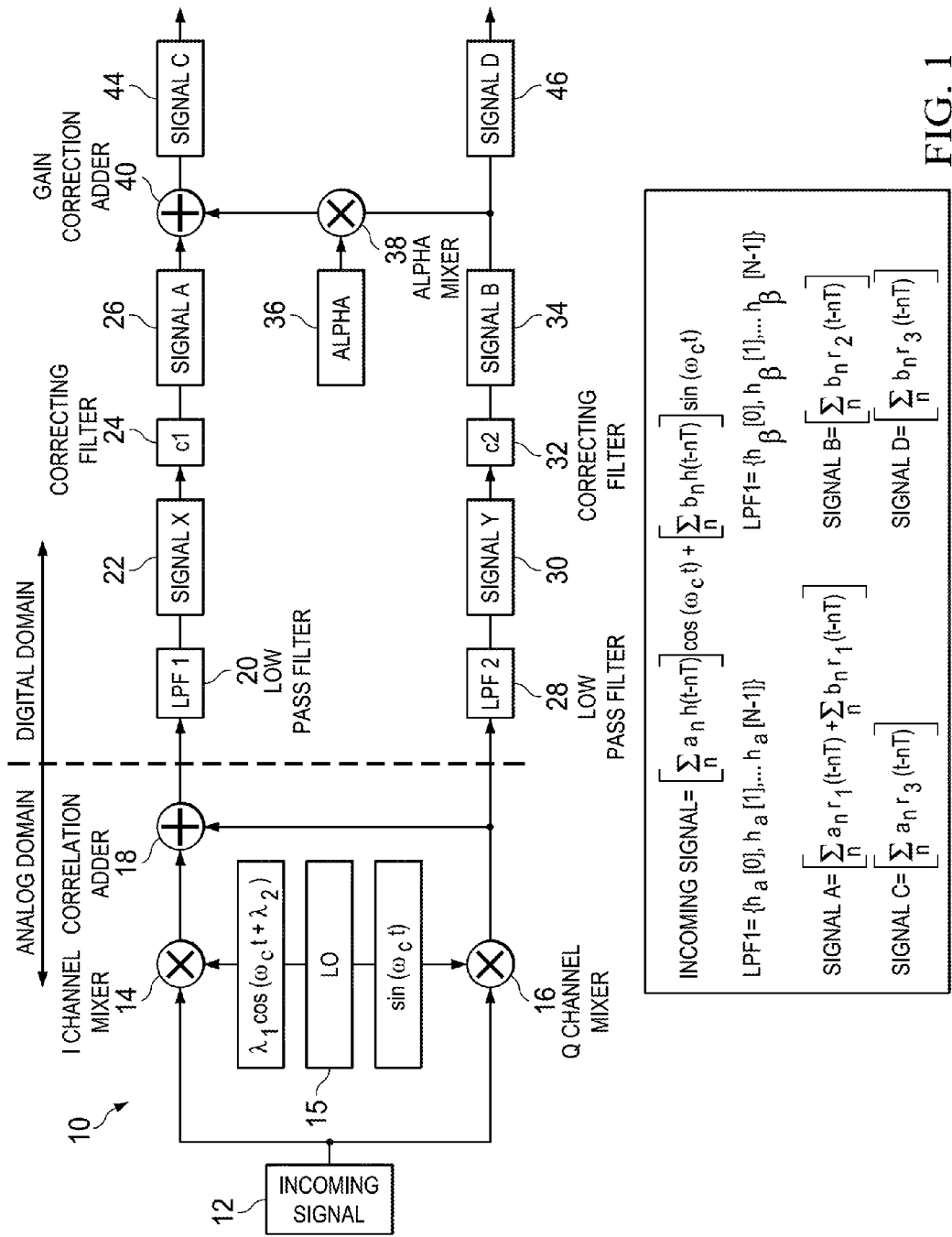
FIG. 1 is a simplified circuit diagram of a circuit architecture for I/Q mismatch mitigation in direct conversion receivers in accordance with one embodiment.

The present disclosure provides for DCR circuit architecture that can compensate for IQ mismatches. Ideal (theoretical) DCRs translate a frequency band of interest in the incoming signal to zero frequency and employ low pass filters (LPFs) to suppress nearby interferers. In practice, however, analog implementations of DCRs generally suffer from I/Q imbalances due to gain and phase errors generated by components of the LPFs and the local oscillators in the I/Q paths. As a result, the performance of the DCRs and the quality of the received signal can be degraded.

For example, assuming an incoming signal (s) at the DCR having in-phase (I-channel) and quadrature phase (Q-channel) components as follows:

$$s = \left[\sum_n a_n h(t-nT)\right]\cos(\omega_c t) + \left[\sum_n b_n h(t-nT)\right]\sin(\omega_c t) \quad (1)$$

where $\omega_c$ is the frequency of the signal, $a_n$ and $b_n$ are the in-phase and quadrature phase amplitude coefficients respectively, and $h(t-nT)$ is a channel impulse response function, which is a function of time (t) and an index (n) times the timestamp (T) at which the signal is transmitted. In a general sense, a channel impulse response is a reaction of a dynamic system in response to some external change, with the impulse response describing the reaction as a function of time (or another independent variable that parameterizes the dynamic behavior of the system). In typical DCRs, the incoming signal is passed through an I-channel mixer, configured to remove the in-phase frequency, and a Q-channel mixer, configured to remove the quadrature phase frequency through heterodyning. The I and Q channels are necessary for angle modulated signals because the two channels contain different information and may result in irreversible corruption if they overlap each other without being separated into two phases. In typical DCRs, the signals in the two channels are passed through respective LPFs, and added at the outputs to obtain the demodulated signal.

In general, a frequency mixer is a 3-port electronic circuit, with two input ports (e.g., providing the incoming signal, and a reference signal), and an output port. The ideal frequency mixer mixes the incoming signal and the reference signal from a local oscillator (LO) such that the output signal frequency ($f_{out}$) is either the sum (or difference) of the frequencies ($f_{in1}$, $f_{in2}$) of the inputs. In other words:

$$f_{out} = f_{in1} \pm f_{in2} \quad (2)$$

When the desired output frequency is lower than the frequency of the incoming signal, the process is called down-conversion, and the output frequency is the difference of the frequencies of the two inputs. When $f_{in1}=f_{in2}$, the output frequency is zero. The reference signal may be either a sinusoidal continuous wave, or a square wave, depending on the application. Any nonlinear device, such as Schottky diodes, gallium arsenide field effect transistors and complementary metal-oxide semiconductor transistors can be used to make a mixer circuit.

Heterodyning is a radio signal processing technique, in which new frequencies are created by combining or mixing two frequencies. Heterodyning is useful for frequency shifting signals into a new frequency range, and is also involved in the processes of modulation and demodulation. The two frequencies are combined in the mixer. Heterodyning is based on the trigonometric identity:

$$\sin\theta \sin\phi = \tfrac{1}{2}\cos(\theta-\phi) - \tfrac{1}{2}\cos(\theta+\phi) \quad (3)$$

The product $\sin\theta \sin\phi$ represents the mixing of a sine wave with another sine wave (e.g., in a mixer). The right hand side shows that the resulting signal is the difference of two sinusoidal terms, one at the sum of the two original frequencies, and the other at the difference of the two original frequencies, each of which can be considered to be a separate signal.

In DCR applications, the incoming signal, having a frequency of $\omega_c$ may be mixed with a reference signal having the same frequency, creating two output signals, one output signal having a frequency of $2\omega_c$ and the other output signal being a direct current (DC) component (having zero frequency). Typically only one of the new frequencies (e.g., DC component) is desired, and the other output signal is filtered out of the output of the mixer using the LPF.

In general, an LPF is an electronic filter that passes low-frequency signals and attenuates signals with frequencies higher than a cutoff frequency. An ideal low-pass filter completely eliminates all frequencies above the cutoff frequency while passing those below unchanged (e.g., its frequency response can be considered to be a rectangular function). Real filters for real-time applications approximate the ideal filter by truncating the impulse response; however, the truncating can require delaying the signal for a moderate period of time. This delay can be manifested as a phase difference. The LPFs can be mathematically represented by their respective tap weights, or filter coefficients (e.g., $h_\alpha[i]$). An N-th order filter can be represented by the taps $h_\alpha[0], h_\alpha[1], \ldots h_\alpha[N-1]$.

Typically, the DCR acquires a complex signal, which is a distorted version of a desired baseband signal. The distortions caused by the receiver can be a result of the local oscillator phase error, which is frequency independent and of the order of 2 to 3 degrees. To operate without I/Q errors, the local oscillator of the frequency mixer must produce signals with a phase shift of exactly 90°, which is impossible to meet in practice. Moreover, the gains and phases responses of the I-channel and the Q-channel must be matched. However, in practice, mismatches in analog components cause an imbalance in the gain and phase responses of the I-channel and the Q-channel. The errors in the frequency mixers can be denoted by a cumulative error in the I-channel mixer as a reference signal R:

$$R = \lambda_1 \cos(\omega_c t + \lambda_2) \quad (4)$$

where $\lambda_1$ represents the gain mismatch between the I-channel and the Q-channel, and $\lambda_2$ represents the phase mismatch of the local oscillator. (In the ideal scenario, $\lambda_1=1$, and $\lambda_2=0$.)

The distortions at the DCR can also be a result of a frequency dependent channel impulse response mismatch between the LPFs in the I-channel and Q-channel. The LPFs in the I-channel and the Q-channel of the DCR must have identical characteristics (e.g., identical tap weights). However, actual LPFs have slightly mismatched tap weights, which can lead to I/Q errors, with different channel impulse response characteristics (i.e., the channel impulse response mismatch) between the signals in the I-channel and the Q-channel. The errors from the phase difference between the oscillators of the frequency mixers and changes in the phase difference between the LPFs in the I/Q paths can corrupt the signal to a large extent and severely distort the signal to noise ratio. In general, the gain imbalance appears as a non-unity scale factor in the amplitude while the phase imbalance corrupts one channel with a fraction of data pulses in the other channel.

Turning to FIG. 1, FIG. 1 is a simplified block diagram of electrical circuit 10 that implements circuit architecture for I/Q mismatch mitigation in direct conversion receivers. Electrical circuit 10 is configured to minimize I/Q mismatch based on injection of local oscillator phase error. According to various embodiments, incoming signal 12 may be mathematically represented as s (provided earlier herein in equation (1)). An I-channel mixer 14 may approximately translate an I-channel component of the incoming signal 12 to direct current (DC) by injecting a reference signal R as provided in equation (3) by a local oscillator (LO) 15. A Q-channel mixer 16 may approximately translate the Q-channel component of incoming signal 12 to direct current by injecting, by LO 15, another reference signal with a phase shift of 90° with the reference signal provided to I-channel mixer 14.

A correlation adder 18 may add the output signals from I-channel mixer 14 and Q-channel mixer 16 in an analog domain (e.g., signal processing space in which signals representing physical measurements are continuous, and continuously varying). LPF 20 having filter coefficients $\{h_\alpha[0], h_\alpha[1], \ldots h_\alpha[N-1]\}$ may remove high frequencies from the output signal of correlation adder 18, and output signal X 22. Signal X 22 may be passed through a correcting filter 24 (c1), and an output signal A 26 may be obtained therefrom.

The output signal from Q-channel mixer 16 may also be passed through another LPF 28 having filter coefficients $\{h_\beta[0], h_\beta[1], \ldots h_\beta[N-1]\}$, which may remove the non-DC components from the signal, and output signal Y 30. Signal Y 30 may be passed through a correcting filter 32 (c2) to obtain an output signal B 34. Correcting filters 24 and 32 may be configured to remove mismatches between filter coefficients of LPF 20 and LPF 28. For example, assume that LPF 20, LPF 28, correcting filter 24 and correcting filter 32 are 3rd order filters, with the following filter coefficients: LPF 20 has the filter coefficients $\{h_\alpha[0], h_\alpha[1], h_\alpha[2]\}$; LPF 28 has the filter coefficients $\{h_\beta[0], h_\beta[1], h_\beta[2]\}$; correcting filter 24 has the filter coefficients $\{c_1[0], c_1[1], c_1[2]\}$; and correcting filter 32 has the filter coefficients $\{c_2[0], c_2[1], c_2[2]\}$. Note that the filter coefficients of LPF 20 and LPF 28 are known quantities, and the filter coefficients of correcting filters 24 and 32 may be determined from additional computations. Assume, without loss of generality, that $c_2[0]=1$. The filters can be mathematically represented by the following equations:

$$h_\alpha = [h_\alpha[0], h_\alpha[1], h_\alpha[2]]^T \quad (5)$$

$$h_\beta = [h_\beta[0], h_\beta[1], h_\beta[2]]^T \quad (6)$$

$$c_1 = [c_1[0], c_1[1], c_1[2]]^T \quad (7)$$

$$c_2 = [1, c_2[1], c_2[2]]^T \quad (8)$$

Correcting filters 24 and 32 may be configured so that $r_1 = h_\alpha \times c_1 = r_2 = h_\beta \times c_2$, where $r_1$ and $r_2$ are equivalent filter coefficient matrices (e.g., set of equivalent filter coefficients) representing the combination of LPF 20 and correcting filter 24 in the I-channel, and LPF 28 and correcting filter 32 in the Q-channel, respectively. Filters having equivalent filter coefficients $r_1$ and $r_2$ may represent low pass filters in the I-channel and the Q-channel, respectively, having identical tap weights, with no mismatches. To remove the mismatch between the low pass filtering on the I-channel and the Q-channel, $r_1$ may be equalized to $r_2$. Thus, the effective filtering behavior of the I-channel and the Q-channel may be configured to be identical. Mathematically, the matrix equation can be written in the following form:

$$\begin{bmatrix} h_1[0] & 0 & 0 & 0 & 0 \\ h_1[1] & h_1[0] & 0 & -h_2[0] & 0 \\ h_1[2] & h_1[1] & h_1[0] & -h_2[1] & -h_2[0] \\ 0 & h_1[2] & h_1[1] & -h_2[2] & -h_2[1] \\ 0 & 0 & h_1[2] & 0 & -h_2[2] \end{bmatrix} \begin{bmatrix} c_1[0] \\ c_1[1] \\ c_1[2] \\ c_2[1] \\ c_2[2] \end{bmatrix} = \begin{bmatrix} h_2[0] \\ h_2[1] \\ h_2[2] \\ 0 \\ 0 \end{bmatrix} \quad (9)$$

Solving the matrix equation can lead to determining the correcting filter coefficients $\{c_1[0], c_1[1], c_1[2]\}$ and $\{c_2[0], c_2[1], c_2[2]\}$ (with $c_2[0]=1$), and designing correcting filters 24 and 32 appropriately (e.g., with electrical components (e.g., resistors, capacitors, etc.)).

Alternatively, to create effective filters having the same equivalent filter coefficients for the I-channel and the Q-channel, a predetermined cost function may be minimized (e.g., to zero). The cost function may proportional to a sum of squares of a difference between a first set of equivalent filter coefficients $\{r_1[0], r_1[1], \ldots r_1[N-1]\}$ and a second set of equivalent filter coefficients $\{r_2[0], r_2[1], \ldots r_1[N-1]\}$:

$$f(r_1, r_2) = \theta\{(r_1[0]-r_2[0])^2 + (r_1[1]-r_2[1])^2 + \ldots + (r_1[N-1]-r_2[N-1])^2\} \quad (10)$$

where the first set of equivalent filter coefficients correspond to the I-channel signal component, and the second set of equivalent filter coefficients correspond to the Q-channel signal component. The equation may be re-written as:

$$f(r_1, r_2) = \theta\left\{\sum_{k=0}^{N-1} r_1^2[k] + \sum_{k=0}^{N-1} r_2^2[k] - 2\sum_{k=0}^{N-1} r_1[k]r_2[k]\right\} \quad (11)$$

If $r_1 = r_2$ (as is the case with zero mismatch low pass filters in the I-channel and the Q-channel), the cost function $f(r_1, r_2)$ will be zero. The cost function can also be obtained by solving the following equations:

$$E\{A^2\} = \sigma^2 \sum_{k=0}^{N-1} r_1^2[k] + \sigma^2 \sum_{k=0}^{N-1} r_1^2[k] = 2\sigma^2 \sum_{k=0}^{N-1} r_1^2[k] \quad (12)$$

$$E\{B^2\} = \sigma^2 \sum_{k=0}^{N-1} r_2^2[k] \quad (13)$$

$$E\{AB\} = \sigma^2 \sum_{k=0}^{N-1} r_1[k]r_2[k] \quad (14)$$

$$f(r_1, r_2) = \frac{E\{A^2\}}{2} + E\{B^2\} - 2E\{AB\} \quad (15)$$

$$= \sigma^2 \left\{\sum_{k=0}^{N-1} r_1^2[k] + \sum_{k=0}^{N-1} r_2^2[k] - 2\sum_{k=0}^{N-1} r_1[k]r_2[k]\right\}$$

where $E\{A\}$ is the expected value of signal A 26, $E\{B\}$ is the expected value of signal B 34, and $\sigma^2$ is the power of incoming signal 12. Thus, the predetermined cost function may be a function of the power of incoming signal 12.

The phase and gain imbalance between the I-channel and Q-channel may be represented mathematically in matrix form as follows:

$$\begin{bmatrix} I \\ Q \end{bmatrix} = \begin{bmatrix} \gamma_1 & \gamma_2 \\ 0 & 1/2 \end{bmatrix} \begin{bmatrix} \sum_n a_n h(t-nT) \\ \sum_n b_n h(t-nT) \end{bmatrix} \begin{bmatrix} h_a \\ h_a \end{bmatrix} \quad (16)$$

where $\gamma_1$ and $\gamma_2$ are errors in the phase and gain resulting from non-idealities in the DCR, and $h_a$ is the filter coefficient of an idealized low pass filter on both I-channel and Q-channel. Multiplying equation 12 by the inverse of the error matrix can remove the phase and gain error.

Signal A 26 may be mathematically represented as follows:

$$A = \{r_1\}\left[\left\{\sum_n a_n h(t-nT)\right\} \cos(\omega_c t) + \left\{\sum_n b_n h(t-nT)\right\} \sin(\omega_c t)\right] \quad (17)$$

$$[(\lambda_1 \cos(\lambda_2))\cos(\omega_c t) + (1 - \lambda_1 \sin(\lambda_2))\sin(\omega_c t)]\}$$

Rearranging the terms, and rewriting A in terms of the effective filter coefficients of the filter combination of LPF 20 and correcting filter 24 ($r_3 \times h = r_2 \times h = r_1 \times h$):

$$A = \quad (18)$$

$$0.5(\lambda_1 \cos(\lambda_2)) \sum_n a_n r_3(t-nT) + 0.5(1 - \lambda_1 \sin(\lambda_2)) \sum_n b_n r_3(t-nT)$$

If it is assumed that after filter calibration of LPFs 20 and 28 with correcting filters 24 and 32, there is no mismatch between the I-channel and Q-channel components, then, inserting a gain of $$\frac{1}{0.5(\lambda_1\cos(\lambda_2))}$$

to signal A 26 (e.g., at correcting filter 24) may yield a signal $\tilde{A}$ as follows:

$$\tilde{A} = A\left(\frac{1}{0.5(\lambda_1\cos(\lambda_2))}\right) = \qquad (19)$$

$$0.5(\lambda_1\cos(\lambda_2))\sum_n a_n \frac{1}{0.5(\lambda_1\cos(\lambda_2))} r_3(t-nT) +$$

$$0.5(1-\lambda_1\sin(\lambda_2))\sum_n b_n \frac{1}{0.5(\lambda_1\cos(\lambda_2))} r_3(t-nT)$$

The component $$\frac{(1-\lambda_1\sin(\lambda_2))}{(\lambda_1\cos(\lambda_2))}\sum_n b_n r_3(t-nT)$$

may be canceled by multiplying the Q-channel signal component by $$\frac{(1-\lambda_1\sin(\lambda_2))}{(\lambda_1\cos(\lambda_2))}$$

and subtracting it from $\tilde{A}$. A scalar compensation coefficient, alpha 36, also called the "gain correction" may be defined as follows:

$$\text{Alpha} = \frac{(1-\lambda_1\sin(\lambda_2))}{(\lambda_1\cos(\lambda_2))} \qquad (20)$$

Gain correction alpha 36 may be a function of the gain mismatch ($\lambda_1$) between the outputs of I-mixer 14 in the I-channel and Q-mixer 16 in the Q-channel of electrical circuit 10, and the phase mismatch ($\lambda_2$) of LO 15.

According to various embodiments, gain correction alpha 36, may be mixed with output of correcting filter 32 at alpha mixer 38, and added (in some embodiments with a negative sign) with an output of correcting filter 24 at gain correction adder 40, resulting in signal C 44 on the I-channel, and signal D 46 on the Q channel. Mathematically, in scalar form, signal C 44 and signal D 48 can be represented by the following equations, respectively:

$$C = \left[\sum_n a_n r_3(t-nT)\right] \qquad (21)$$

$$D = \left[\sum_n b_n r_3(t-nT)\right] \qquad (22)$$

where C is signal C 44, D is signal D 46, and $r_3=r_2=r_1$, the filter coefficients of the calibrated filters obtained by combining LPF 20 and LPF 28 with correcting filters 24 and 32, respectively.

Figure 2:
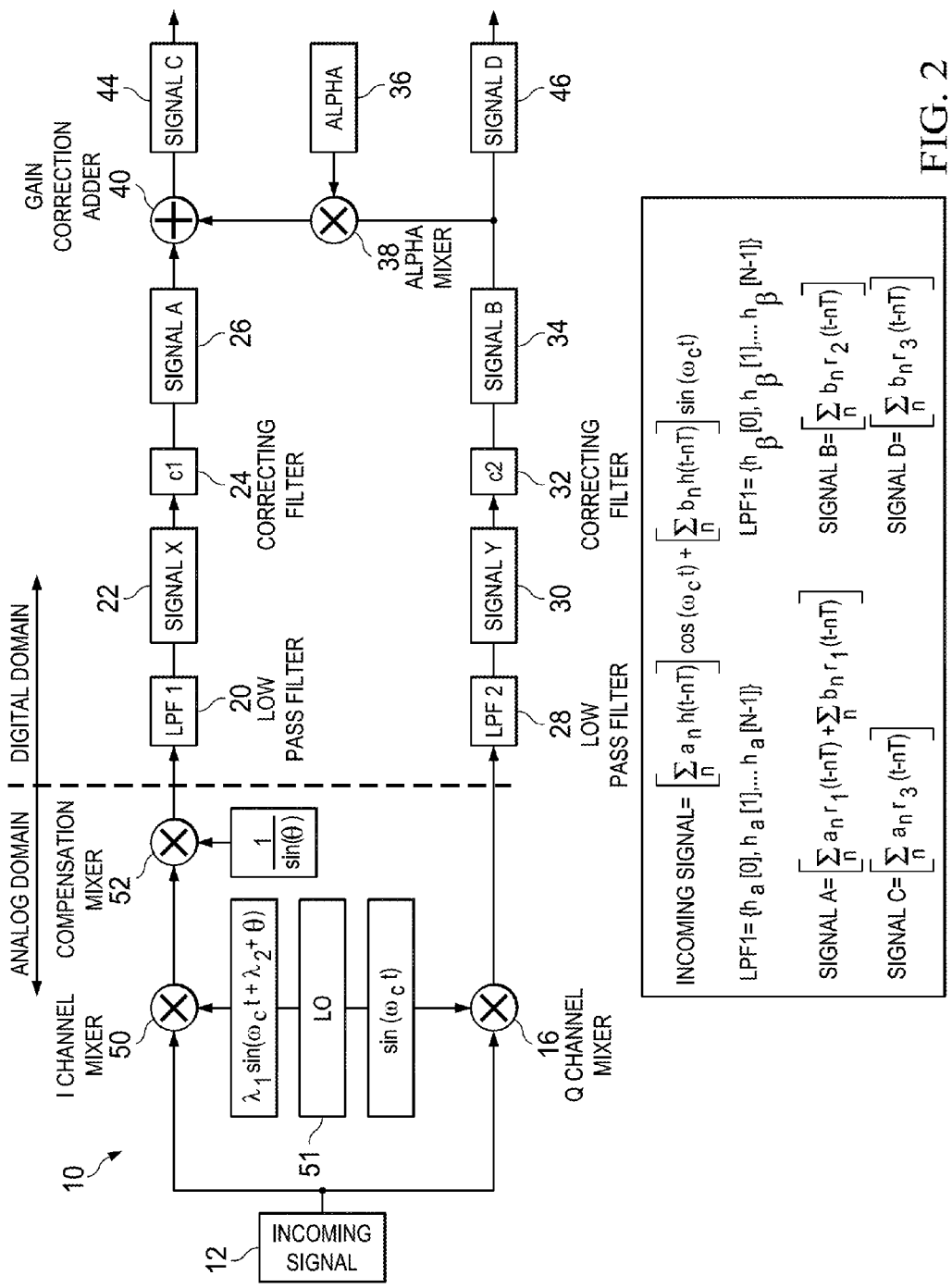
FIG. 2 is a simplified diagram illustrating another embodiment of the circuit architecture.

Turning to FIG. 2, FIG. 2 is a simplified block diagram illustrating another embodiment of electrical circuit 10. Incoming signal 12 may be mathematically represented as s (provided earlier herein). An I-channel mixer 50 may be provided with a reference input signal $R_I$ from LO 51 as follows:

$$R_I = \lambda_1 \sin(\omega_c t + \lambda_2 + \theta) \qquad (23)$$

where $\theta$ is a predetermined phase shift with another reference signal provided at Q-channel mixer 16. A compensation mixer 52 may multiply the output of I-channel mixer 50 with the constant factor, namely, one over $\sin(\theta)$ (i.e., $1/\sin(\theta)$), to compensate for the predetermined phase shift $\theta$ added into the reference signal of I-channel mixer 50.

In some embodiments, $\theta$ may comprise 45°, and the constant factor may equal two over square root of two (2/sqrt(2)). Adding 45° to the reference signal of I-channel mixer 14 and mixing with 2/sqrt(2) at compensation mixer 52 may emulate adding the output of Q-channel mixer 16 to the output of I-channel mixer 14 (with a reference signal having a 90° phase shift from that at Q-channel mixer 16) using correlation adder 18 of FIG. 1. Adding the output of Q-channel mixer 16 to the output of I-channel mixer 14 in the analog domain may be complicated and prone to additional errors. By emulating the addition using compensation mixer 52, the circuit may be simplified without substantially impacting the performance.

LPF 20 having filter coefficients $\{h_\alpha[0], h_\alpha[1], \ldots h_\alpha[N-1]\}$ may remove DC components from the output of compensation mixer 52, and output signal X 22. Mathematically, signal X 22 may be represented as follows:

$$X = \{h_\alpha\}\left(\left\{\sum_n a_n h(t-nT)\cos(\omega_c t) + \sum_n b_n h(t-nT)\sin(\omega_c t)\right\}\right. \qquad (24)$$

$$\left. \sin(\omega_c t + \theta)\frac{1}{\sin(\theta)}\right)$$

Because $\sin(\omega_c t+\theta)=\cos(\omega_c t)\sin(\theta)+\sin(\omega_c t)\cos(\theta)$, X may be represented as follows:

$$X = \{h_\alpha\}\left(\left\{\sum_n a_n h(t-nT)\cos(\omega_c t) + \sum_n b_n h(t-nT)\sin(\omega_c t)\right\}\right. \qquad (25)$$

$$\left. \left(\cos(\omega_c t) + \sin(\omega_c t)\left(\frac{\cos(\theta)}{\sin(\theta)}\right)\right)\right)$$

Rearranging the terms yields the following equation for X:

$$X = \frac{1}{2}\sum_n a_n h_1(t-nT) + \frac{1}{2}\frac{\cos(\theta)}{\sin(\theta)}\sum_n b_n h_1(t-nT) \qquad (26)$$

$h_1=h_\alpha \times h$, and $\sin^2(\omega_c t)=\frac{1}{2}(1-\cos(2\omega_c t))$; $\cos^2(\omega_c t)=\frac{1}{2}(1+\cos(2\omega_c t))$; and $\sin(2\omega_c t)=2\sin(\omega_c t)\cos(\omega_c t)$. All the terms with $2\omega_c t$ may be removed by LFP 20. In an example embodiment where $\theta$ is 45°, $$\frac{\cos\left(\frac{\pi}{4}\right)}{\sin\left(\frac{\pi}{4}\right)} = 1.$$

Thus, signal X 22 may be represented as follows:

$$X = \frac{1}{2}\sum_n a_n h_1(t-nT) + \frac{1}{2}\sum_n b_n h_1(t-nT) \qquad (27)$$

It may be noted that as θ approaches 90°, the correlated term may be attenuated and the quality estimation may be poor. On the other hand, as θ approaches 0°, the gain at the I-channel may increase (e.g., to infinity), indicating that the I-channel information may be over-attenuated, and therefore, the quality of estimation of the I-channel signal component may be poor. When θ approaches 45°, the quality estimation may reach an optimally desired value.

The output signal from Q-channel mixer 16 may also be passed through another LPF 28, which may remove the high frequency components from the signal, and output signal Y 30. Signal Y 30 may be passed through correcting filter 32 to obtain output signal B 34. Correcting filters 24 and 32 may be configured to remove mismatches between filter coefficients of LPF 20 and LPF 28.

According to various embodiments, gain correction alpha 36 (as described earlier herein) may be mixed with signal B 34 at alpha mixer 38, and added to the output of correcting filter 24, namely, signal A 26, at gain correction adder 40 to obtain signal C 44. Mathematically, signal A 26 may be represented by the following matrix equation:

$$A = \{r_1\}\left\{\left[\left\{\sum_n a_n h(t-nT)\right\}\cos(\omega_c t) + \left\{\sum_n b_n h(t-nT)\right\}\sin(\omega_c t)\right] \\ [\lambda_1 \sin(\lambda_2 + \theta)\cos(\omega_c t) + \lambda_1 \cos(\lambda_2 + \theta)\sin(\theta)]\frac{1}{\sin(\theta)}\right\} \quad (28)$$

Because $\sin(\lambda_2+\theta)=\cos(\lambda_2)\sin(\theta)+\sin(\lambda_2)\cos(\theta)$, A may be rewritten as follows:

$$A = 0.5\left[\lambda_1\left\{\cos(\lambda_2) + \frac{\cos(\theta)}{\sin(\theta)}\sin(\lambda_2)\right\}\right]\sum_n a_n r_3(t-nT) + \\ 0.5\{\lambda_1 \cos(\lambda_2 + \theta)\}\sum_n b_n r_3(t-nT) \quad (29)$$

By defining gain correction alpha 36 as a function of the gain mismatch $\lambda_1$ between the I-channel and Q-channel components, and $\lambda_2$, the phase mismatch of LO 15, for example, $$\alpha = \frac{\lambda_1 \cos(\lambda_2 + \theta)}{\lambda_1\left\{\cos(\lambda_2) + \frac{\cos(\theta)}{\sin(\theta)}\sin(\lambda_2)\right\}},$$

A can be rewritten in matrix form as:

$$A = Xc_1 + \alpha Y c_2 \quad (30)$$

where A is the matrix form of signal A 26, X is the matrix form of signal X 22, Y is the matrix form of signal Y 30, $\alpha$ is gain correction alpha 36 and $c_1$ and $c_2$ are the correcting filter coefficient matrices of correcting filters 24 and 32, respectively. In scalar form, signal A 26 may be represented as follows:

$$A = \left[\sum_n a_n r_1(t-nT) + \sum_n b_n r_1(t-nT)\right] \quad (31)$$

Signal B 44 may be mathematically represented by the following matrix equation:

$$B = Y c_2 \quad (32)$$

In scalar form, signal B 44 may be represented as follows:

$$B = \left[\sum_n b_n r_2(t-nT)\right] \quad (33)$$

Gain correction alpha 36 may be obtained from minimizing the cost function described earlier herein, by substituting for signal A and signal B to obtain the cost function as follows:

$$f(r_1,r_2)=0.5a^TX^TXa+0.5ab^TY^TYb+\alpha a^TX^TYb+b^TY^TYb- \\ 2ab^TY^TYb-2ab^TY^TXa \quad (34)$$

Rearranging the terms leads to the following equation for the cost function:

$$f(r_1,r_2)=0.5c_1^TX^TXc_1+c_2^TY^TYc_2(1-1.5\alpha)-\alpha c_2^TY^TXc_1 \quad (35)$$

Because computations in the digital domain (e.g., signal processing space where the signals are discrete time signals generated by digital modulation) are relatively easier than the same computations in the analog domain, minimizing the predetermined cost function can be performed in the digital domain to obtain the filter coefficients $c_1$ and $c_2$, and gain correction, alpha 36.

Figure 3:
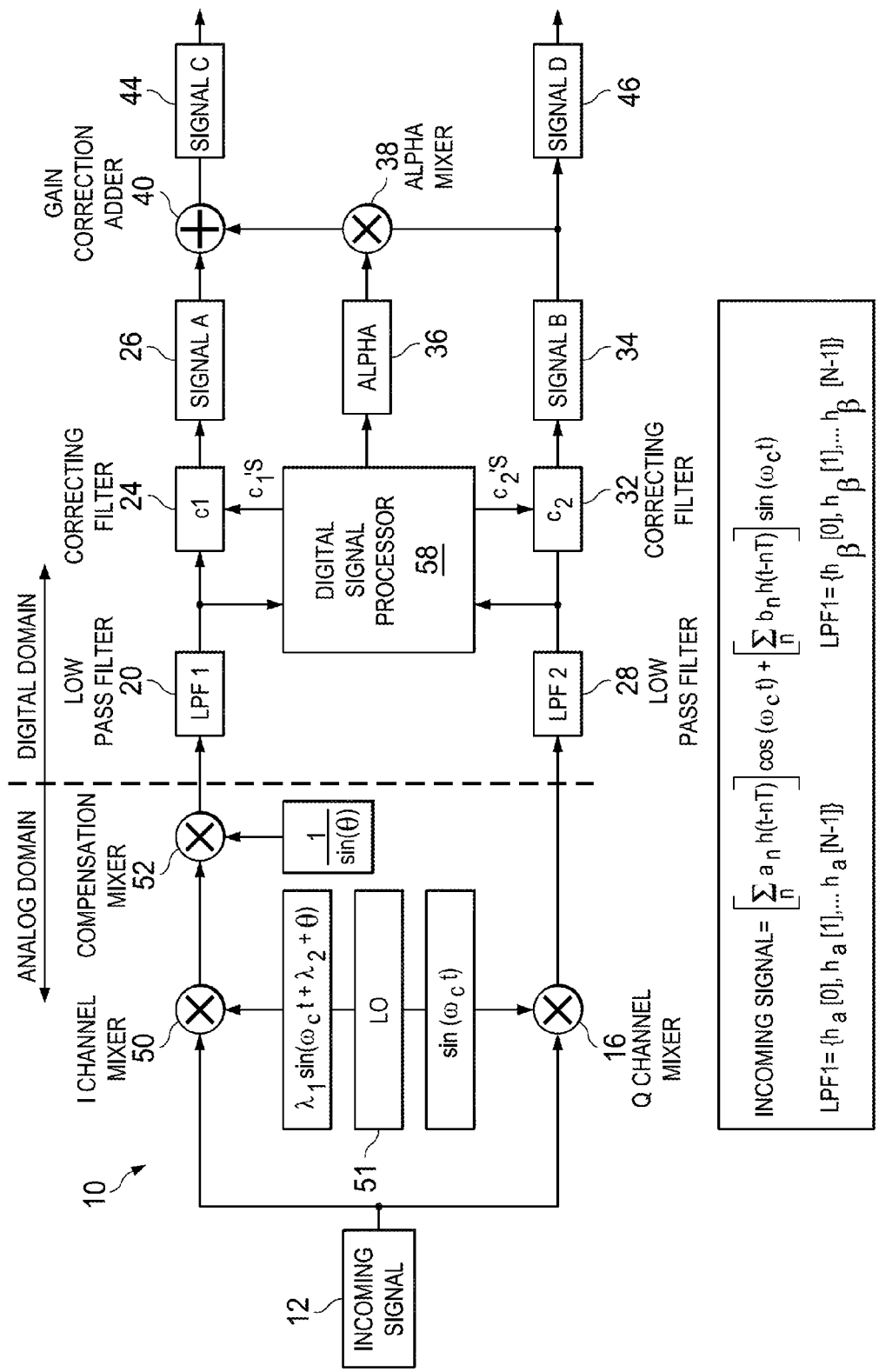
FIG. 3 is a simplified diagram illustrating yet another embodiment of the circuit architecture.

Turning to FIG. 3, FIG. 3 is a simplified block diagram illustrating another example embodiment of electrical circuit 10. Incoming signal 12 may be mathematically represented as s (provided earlier herein). An I-channel mixer 50 may be provided with a reference input signal $R_I$ from LO 51, as provided earlier herein. Reference signal $R_I$ may include a predetermined phase shift of θ (e.g., 45° in an example embodiment) with another reference signal provided at Q-channel mixer 16. A compensation mixer 52 may multiply the output of I-channel mixer 50 with the constant factor, namely, one over $\sin(\theta)$ (e.g., two over square root of two (2/sqrt(2)) in an example embodiment where the predetermined phase shift is 45°), to compensate for the predetermined phase shift of θ added into the reference signal of I-channel mixer 50. LPF 20 may remove high frequency components from the output of compensation mixer 52.

According to some embodiments, an analog-to-digital converter (ADC) (not shown) may convert the analog output of LPF 20 to a digital signal. The output signal from Q-channel mixer 16 may also be passed through LPF 28, which may remove the high frequency components from the signal. According to some embodiments, another ADC (not shown) may convert the analog output of LPF 28 to a digital signal. The outputs from LPF 20 and LPF 28 may be provided to correcting filters 24 and 32, respectively. In other embodiments, LPF 20 may include a digital filter that samples the output from compensation mixer 52 in the digital domain, and output a digital signal directly to DSP 58. Similarly, LPF 28 may include a digital filter that samples the output from Q-channel mixer 16 in the digital domain, and output a digital signal.

A digital signal processor (DSP) 58 may listen to the outputs from LPF 20 and LPF 28. DSP 58 may process the predetermined cost function to provide appropriate gain correction alpha values and filter coefficients $c_1$ and $c_2$ to correcting filters 24 and 32. DSP 58 may provide (and/or update) gain correction alpha 36 to alpha mixer 38. Correcting filters 24 and 32 may correct the incoming I-channel signal component samples and Q-channel signal component samples in real time while DSP 58 may update the gain correction alpha values and filter coefficients $c_1$ and $c_2$ in real time as best effort. According to some embodiments, the best effort operations can reduce power consumption of DSP 58. The output from correcting filter 32, namely, signal B 34 may be mixed with alpha 26 at alpha mixer 38 and added with the output from correcting filter 24, namely, signal A 26 at gain correction adder 40. The output from electrical circuit 10 may comprise signal C 44 in the I-channel, and signal D 46 in the Q-channel.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In one example embodiment, electrical circuit 10 of the FIGURES may be implemented on a motherboard of an associated electronic device. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, additional sensors, controllers for audio/video display, and peripheral devices may be attached to the motherboard as plug-in cards, via cables, or integrated into the motherboard itself.

In another example embodiment, electrical circuit 10 of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors and memory elements, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that electrical circuit 10 of the FIGURES and its teachings are readily scalable and can accommodate a large number of components, as well as more complicated/sophisticated arrangements and configurations. Accordingly, the examples provided should not limit the scope or inhibit the broad teachings of electrical circuit 10 as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An electrical circuit, comprising:
   a local oscillator configured to generate a first reference signal and a second reference signal having a predetermined phase shift with the first reference signal;
   an I-channel mixer configured to inject the first reference signal to an incoming signal and generate a first output, wherein the incoming signal includes an I-channel signal component and a Q-channel signal component;
   a compensation mixer configured to multiply the first output with a constant factor to generate a second output, wherein the second output includes the I-channel signal component and the Q-channel signal component;
   a first low pass filter configured to attenuate frequencies in the second output to generate a third output; and
   a first correcting filter configured to filter the third output to generate a fourth output, wherein the first correcting filter is configured to reduce a channel impulse response mismatch between the first low pass filter and a second low pass filter, wherein the second low pass filter is configured to attenuate frequencies in a Q-channel of the incoming signal.

2. The electrical circuit of claim 1, wherein the first reference signal and the second reference signal comprise sinusoidal functions.

3. The electrical circuit of claim 1, wherein the constant factor is equal to one over sine of the phase shift.

4. The electrical circuit of claim 1, wherein the phase shift comprises 45° and the constant factor is equal to two over square root of two.

5. The electrical circuit of claim 1, wherein the I-channel mixer and the compensation mixer are in an analog domain, and wherein the first low pass filter and the first correcting filter are in a digital domain.

6. The electrical circuit of claim 5, further comprising:
a Q-channel mixer configured to inject the second reference signal to the incoming signal to generate a fifth output, wherein the second low pass filter is configured to attenuate frequencies in the fifth output to generate a sixth output;
a second correcting filter configured to filter the sixth output to generate a seventh output, wherein the second correcting filter is configured to reduce the channel impulse response mismatch between the first low pass filter and the second low pass filter;
an alpha mixer configured to inject a gain correction to the seventh output to generate an eighth output; and
a gain correction adder configured to add the eighth output with the fourth output to generate a ninth output.

7. The electrical circuit of claim 6, wherein the gain correction comprises a function of a gain mismatch between the first output and the fifth output, and a phase mismatch of the local oscillator.

8. The electrical circuit of claim 6, wherein the Q-channel mixer is in an analog domain and wherein the second low pass filter, the second correcting filter, the alpha mixer, and the gain correction adder are in a digital domain.

9. The electrical circuit of claim 6, wherein a first set of filter coefficients of the first correcting filter, a second set of filter coefficients of the second correcting filter and the gain correction are determined by minimizing a predetermined cost function.

10. The electrical circuit of claim 9, wherein the cost function is proportional to a sum of squares of a difference between a first set of equivalent filter coefficients and a second set of equivalent filter coefficients, wherein the first set of equivalent filter coefficients correspond to the I-channel signal component, and the second set of equivalent filter coefficients correspond to the Q-channel signal component.

11. The electrical circuit of claim 9, wherein the cost function varies with a power of the incoming signal.

12. The electrical circuit of claim 9, wherein the cost function is processed by a digital signal processor.

13. The electrical circuit of claim 12, wherein the digital signal processor inserts the first set of filter coefficients into the first correcting filter, the second set of filter coefficients into the second correcting filter and the gain correction into the alpha mixer.

14. An electrical circuit, comprising:
a local oscillator configured to generate a first reference signal and a second reference signal having a predetermined phase shift with the first reference signal;
an I-channel mixer configured to inject the first reference signal to an incoming signal and generate a first output;
a Q-channel mixer configured to inject the second reference signal to the incoming signal to generate a second output;
a correlation adder configured to add the first output with the second output and generate a third output;
a first low pass filter configured to attenuate frequencies in the third output to generate a fourth output;
a first correcting filter configured to filter the fourth output to generate a fifth output;
a second low pass filter configured to attenuate frequencies in the second output to generate a sixth output; and
a second correcting filter configured to filter the sixth output to generate a seventh output, wherein the first correcting filter and the second correcting filter are configured to reduce a channel impulse response mismatch between the first low pass filter and the second low pass filter.

15. The electrical circuit of claim 14, wherein the phase shift comprises 90°.

16. The electrical circuit of claim 14, further comprising:
an alpha mixer configured to inject a gain correction to the seventh output to generate an eighth output; and
a gain correction adder configured to add the eighth output with the fifth output to generate a ninth output.

17. The electrical circuit of claim 16, wherein the I-channel mixer, the Q-channel mixer and the correlation adder are in an analog domain, and wherein the first low pass filter, the first correcting filter, the second low pass filter, the second correcting filter, the alpha mixer, and the gain correction adder are in a digital domain.

18. The electrical circuit of claim 16, wherein a first set of filter coefficients of the first correcting filter, a second set of filter coefficients of the second correcting filter and the gain correction are determined by minimizing a predetermined cost function.

19. The electrical circuit of claim 18, wherein the cost function varies with a power of the incoming signal.

* * * * *